United States Patent
Tanae

(10) Patent No.: US 7,452,016 B2
(45) Date of Patent: Nov. 18, 2008

(54) NON-CONTACT CARRYING DEVICE

(75) Inventor: Toshikazu Tanae, Tokyo (JP)

(73) Assignee: Koganei Corporation, Tokyo (JP)

( * ) Notice: Subject to any disclaimer, the term of this patent is extended or adjusted under 35 U.S.C. 154(b) by 80 days.

(21) Appl. No.: 10/588,742

(22) PCT Filed: Jan. 17, 2005

(86) PCT No.: PCT/JP2005/000491

§ 371 (c)(1),
(2), (4) Date: Aug. 7, 2006

(87) PCT Pub. No.: WO2005/076342

PCT Pub. Date: Aug. 18, 2005

(65) Prior Publication Data

US 2007/0131660 A1 Jun. 14, 2007

(30) Foreign Application Priority Data

Feb. 9, 2004 (JP) ............................. 2004-032476

(51) Int. Cl.
*B25J 15/06* (2006.01)

(52) U.S. Cl. ..................................................... 294/64.3

(58) Field of Classification Search .............. 294/64.1, 294/64.3; 901/40; 414/752.1

See application file for complete search history.

(56) References Cited

U.S. PATENT DOCUMENTS

| 4,903,717 A | * | 2/1990 | Sumnitsch | 134/99.1 |
| 4,921,520 A | * | 5/1990 | Carlomagno | 65/111 |
| 5,067,762 A | * | 11/1991 | Akashi | 294/64.3 |
| 5,169,196 A | * | 12/1992 | Safabakhsh | 294/64.3 |
| 6,517,130 B1 | * | 2/2003 | Donoso et al. | 294/64.1 |
| 2006/0138793 A1 | * | 6/2006 | Tanae et al. | 294/64.3 |

FOREIGN PATENT DOCUMENTS

| JP | 10-181879 A | 7/1998 |
| JP | 11-515139 A | 12/1999 |

* cited by examiner

*Primary Examiner*—Dean J Kramer
(74) *Attorney, Agent, or Firm*—McCormick, Paulding & Huber LLP

(57) ABSTRACT

A non-contact carrying device 10 holds and carries a carried object W in front of a carrying head 12 without making the carried object contact with the carrying head 12. A gas supplying surface 18 in which an opening portion of a gas supplying hole 19 is formed, an annular holding surface 21 projected rather than the gas supplying surface, and a gas guiding surface 22 smoothly connecting the gas supplying surface 18 with the holding surface 21 are formed in a tip surface of the carrying head 12. A nozzle 24 mounted on the carrying head 12 is provided with a base portion 24a mounted on the carrying head 12 and a disk portion 24b facing to the gas supplying surface 18 and forming an annular slit 25 for discharging gas between the gas supplying surface and the disk portion. Since the nozzle 24 is moved in an axial direction with respect to the carrying head 12 by a screw member 35, width of the slit 25 can be changed. An elastic force is applied to the nozzle 24 in a direction of enlarging the width of the slit 25 by a rubber material 37.

2 Claims, 3 Drawing Sheets

NON-CONTACT CARRYING DEVICE

CROSS-REFERENCE TO RELATED APPLICATIONS

This application is entitled to the benefit of and incorporates by reference essential subject matter disclosed in International Patent Application No. PCT/JP2005/000491 filed on Jan. 17, 2005, and Japanese Patent Application No. 2004-032476 filed on Feb. 9, 2004.

TECHNICAL FIELD

The present invention relates to a non-contact carrying device which carries a carried object while holding the carried object in a non-contact state.

BACKGROUND ART

For a non-contact carrying device which carries a semiconductor wafer as a workpiece, i.e., as a carried object while keeping it in an non-contact state, there is developed a device having: a carrying head in which an annular holding surface is formed at a tip surface of the head and a concave portion having a gas guiding surface smoothly continuing from a center portion toward the holding surface is formed; and a nozzle provided in the concave portion, wherein air is discharged from a slit formed between a circular nozzle head portion and a tip surface of the carrying head (see Patent Document 1). In this kind of non-contact carrying device, gas discharged from the slit of the nozzle flows along and adheres to the gas guiding surface and reaches the holding surface and then flows radially outwardly, and a front of the tip surface of the carrying head always becomes a negative pressure state due to airflow toward the tip surface. Therefore, if the carried object is disposed in front of the carrying head, the carried object approaches the carrying head so as to be sucked in the carrying head due to the negative pressure. The airflow flowing along the holding surface prevents the carried object from directly contacting with the holding surface, so that the carried object is held in the non-contact state by the carrying head and the carried object can be carried by moving the carrying head.

Patent Document 1: Japanese patent Laid-Open Publication No. 10-181879.

DISCLOSURE OF THE INVENTION

The carried objects held and carried by such a non-contact carrying device includes various ones, whose loads are also different depending on kinds of carried objects, and a suction force for holding the carried object is set by a flow velocity and a flow rate of the gas flowing along the gas guiding surface and the holding surface. In a conventional non-contact carrying device, a gap dimension of the slit formed between the nozzle head portion and the tip surface of the carrying head is kept constant. Therefore, pressure of the gas discharged from the slit must be changed in order to suspend and carry the various carried objects different in weight by one kind of non-contact carrying device, so that it is necessary to provide or build a proportional control valve outside or in the non-contact carrying device.

Also, in a non-contact carrying device used to carry, for example, food as the carried object, the device including the nozzle is periodically cleaned in some cases and cleaning solution and like sometimes intrudes as foreign matters into a gas supplying hole through the slit during the cleaning. In this case, there is such a problem that it takes a long time to remove the foreign matters having intruded into the gas supplying hole.

An object of the present invention is to be able to adjust the flow velocity and flow rate of the gas flowing along the tip surface of the carrying head.

Another object of the present invention is to prevent foreign matters from intruding into the slit during cleaning of the carrying head.

A non-contact carrying device according to the present invention is a device for holding and carrying a carried object in a non-contact state, the device comprising: a carrying head having a tip surface including a gas supplying surface in which an opening of a gas supplying hole is formed, an annular holding surface projected rather than the gas supplying surface, and a gas guiding surface smoothly continuing from the gas supplying surface to the holding surface; a nozzle provided with a base portion mounted on the carrying head and a the disk portion facing to the gas supplying surface and forming an annular slit for discharging gas between the gas supplying surface and the disk portion; and a nozzle-moving member changing width of the slit by moving the nozzle in an axial direction with respect to the carrying head.

The non-contact carrying device according to the present invention is such that the nozzle moving member is a screw member mounted on the nozzle and screwed to the carrying head, and the carrying head is provided with an elastic member for applying an elastic force to the nozzle in a direction of enlarging the width of the slit.

The non-contact carrying device according to the present invention is such that a sealing member is mounted on an outer circumferential portion of the disk portion so as to face the gas supplying surface and prevents a foreign matter from intruding into the gas supplying hole when the slit is closed.

According to the present invention, gas such as air discharged from the slit, which is formed between the nozzle and the carrying head and discharges air, adheres to and flows along the gas guiding surface and then adheres to and flows along the holding surface. At this time, a gas layer is formed on the tip surface of the carrying head, so that when the gas is discharged from the slit, a front of the carrying head always becomes a negative pressure state. Therefore, the carried object can be sucked in and held at the carrying head without directly contacting with the carrying head, and the carried object can be carried in the non-contact state by moving the carrying head. The carried object can be also carried while suspended by the carrying head or while floated. Further, by adjusting a gap of the slit, thickness of the gas layer can also be changed according to the load of the carried object. Accordingly, a plurality of kinds of carried objects can be carried by one kind of the non-contact carrying device.

Also, when the gap of the slit is zeroed by making the disk portion of the nozzle contact with the gas supplying surface of the carrying head, the gas supplying hole is closed by the nozzle, so that the foreign matters can be securely prevented from intruding into the gas supplying hole from the outside during cleaning of the carrying head. If the sealing member is provided in the nozzle, intrusion of the foreign matters can be securely prevented.

In addition, when the elastic force is applied to the nozzle in the direction of enlarging the slit, the nozzle can be held at a predetermined axial position with respect to the carrying head without shifting the nozzle.

BEST MODE FOR CARRYING OUT THE INVENTION

Figure 1:
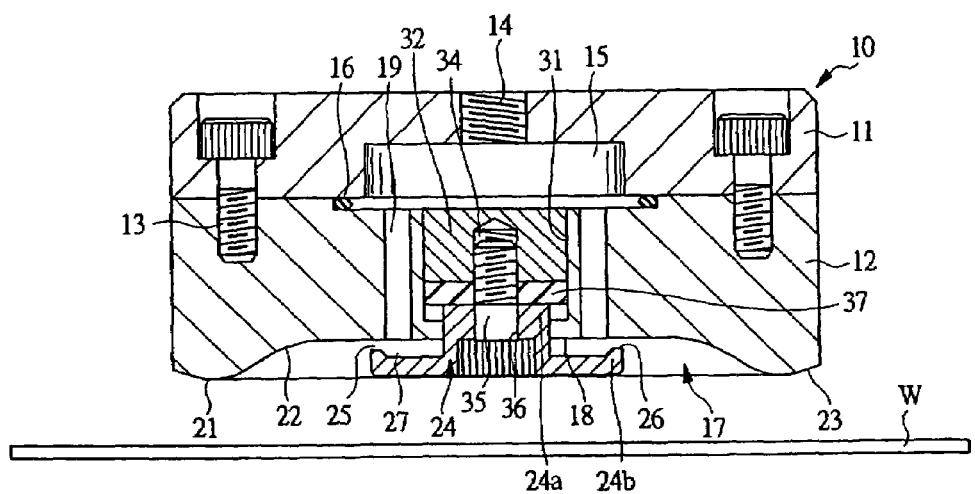
FIG. 1 is a sectional view showing a non-contact carrying device according to an embodiment of the present invention.
Figure 2:
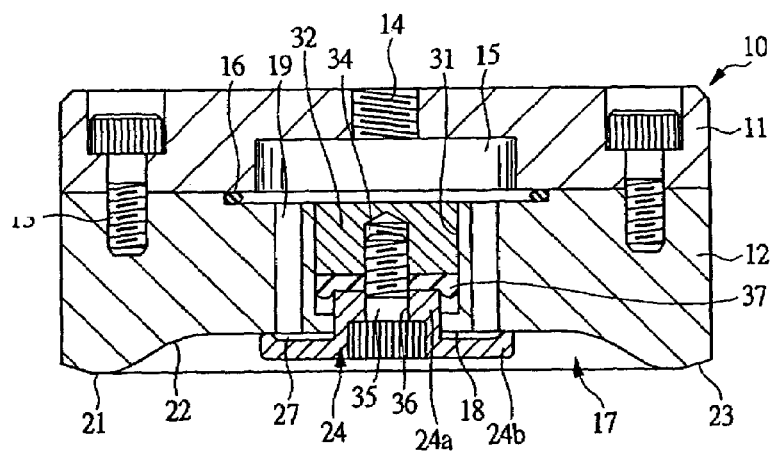
FIG. 2 is a sectional view showing a state in which a slit is closed from a state shown in FIG. 1.
Figure 4:
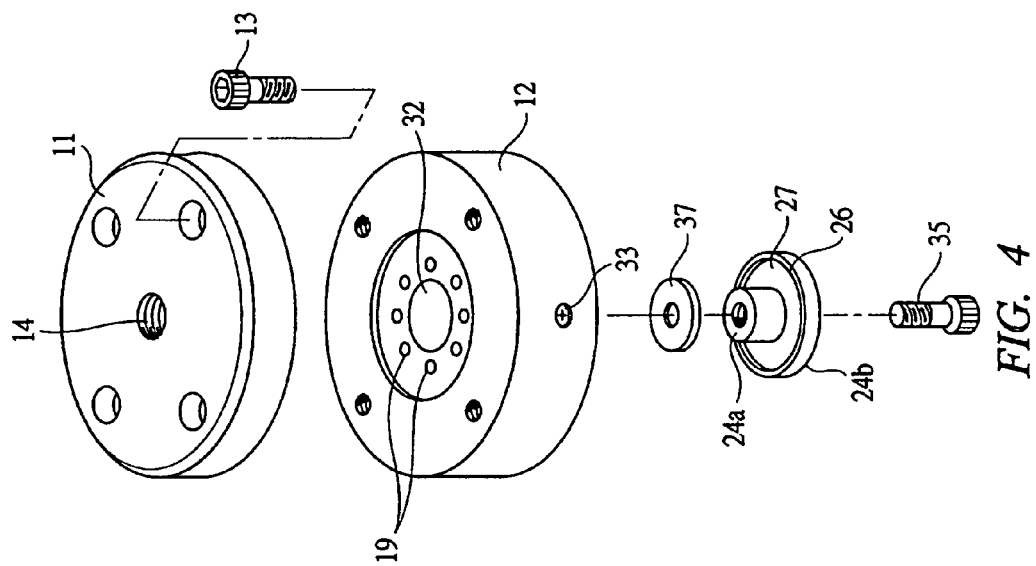
FIG. 4 is an exploded perspective view of the non-contact carrying device.

As shown in FIGS. 1 and 2, a non-contact carrying device 10 includes a disk-shaped base plate 11 and a carrying head 12, and the carrying head 12 is attached to the base plate 11 by a plurality of bolts 13. An unshown moving member is intended to be attached to the base plate 11, and the carrying head 12 is carried and moved by the moving member. Note that FIG. 4 shows only one among the plurality of bolts 13. The base plate 11 is provided with a screw aperture 14 that is screwed to an air supplying pipe for supplying compressed air. A communicating space 15, which communicates with the screw aperture 14, is formed in the base plate 11. A sealing member 16 with a diameter larger than that of the communicating space 15 is incorporated between the base plate 11 and the carrying head 12, whereby air is prevented from leaking between the base plate 11 and the carrying head 12.

A concave portion 17 is formed in a tip of the carrying head 12, and a bottom surface of the concave portion 17 serves as a gas supplying surface 18. A plurality of gas supplying holes 19, which are opened in the gas supplying surface 18 and formed in the carrying head 12, communicate with the communicating space 15. An annular holding surface 21, which projects nearer a front side of the carrying head 12 than the gas supplying surface 18, is formed in the tip surface of the carrying head 12. A gas guiding surface 22, which is formed into a streamline shape and smoothly connects the gas supplying surface 18 with the holding surface 21, is formed between the gas supplying surface 18 and the holding surface 21. Further, a tapered surface 23, which is inclined toward a base end portion of the carrying head 12, is formed between an outer circumferential surface of the carrying head 12 and the holding surface 21.

A nozzle 24 provided with a base portion 24a and a disk portion 24b is mounted on the carrying head 12, wherein the disk portion 24b faces the gas supplying surface 18 so as to cover the gas supplying surface 18 and a portion facing to the disk portion 24b in the entire bottom surface of the concave portion 17 serves as the gas supplying surface 18. An annular slit forming surface 26, which forms a slit 25 for discharging gas along with the gas supplying surface 18, is formed in an outer circumferential portion of the disk portion 24b. The slit forming surface 26 is parallel to the gas supplying surface 18, and an air pocket 27 is formed on an inner-radial side of the slit forming surface 26. Accordingly, the air flowing into the air pocket 27 from the plurality of gas supplying holes 19 is discharged through the slit 25 toward an outer-radial direction from the entire circumferential direction of the nozzle 24, and becomes in a state of adhering to the gas guiding surface 22 and flows along the gas guiding surface 22 in the outer-radial direction, and then becomes in a state of adhering to the holding surface 21 and flows along the holding surface 21 in the outer-radial direction. Next, flow of the air flowing along the holding surface 21 becomes in a state of adhering to the tapered surface 23, and is bent toward a side of the base end portion of the carrying head 12, and is directed to an outer direction of the carrying head 12.

Thus, since the flow along the tip surface of the carrying head 12 in the sate of adhering thereto is formed at the tip surface, the front of the tip surface of the carrying head 12 becomes in a negative pressure state, whereby flow toward the tip surface of the carrying head 12 from a front side of the tip surface is formed and a carried object W is sucked toward the tip surface of the carrying head 12. Accordingly, in a carrying process of the carried object W, the carried object W becomes in a state of being held at the tip surface through a layer of air without directly contacting with the tip surface of the carrying head 12. Therefore, if the carrying head 12 is arranged downward, the carried object W can be carried in a state of being suspended, so that the carried object W can also be carried in a state of arranging the carrying head 12 upward.

Figure 3:
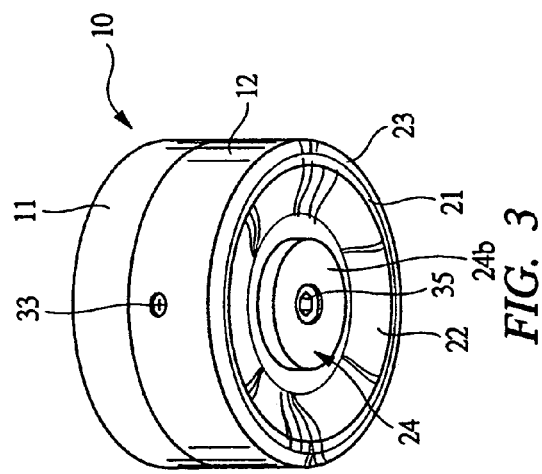
FIG. 3 is a perspective view when viewed from a tip side of the non-contact carrying device.

An attachment hole 31 is formed in a center portion of the carrying head 12, a support block 32 is incorporated in the attachment hole 31, and the support block 32 is fixed to the carrying head 12 by a screw member 33 as shown in FIGS. 3 and 4. Alternatively, the support block 32 may be pressed in and fixed to the carrying head 12, or the support block 32 may be formed integrally with the carrying head 12. A screw aperture 34 is formed in a center portion of the support block 32, and a screw member 35 serving as a nozzle moving member is screwed to the screw aperture 34. By incorporating the screw member 35 in a through hole 36 formed in the base portion 24a of the nozzle 24, the nozzle 24 is mounted on the carrying head 12 and the nozzle 24 is adjusted and moved in an axial direction by rotating the screw member 35.

A rubber material 37 serving as an elastic member is incorporated between the support block 32 and the nozzle 24, and an elastic force is applied to the nozzle 24 by the rubber material 37 in a direction of enlarging width of the slit 25. Accordingly, the width of the slit 25 can be adjusted by the screw member 35, and the nozzle 24 is fixed due to the elastic force applied to the nozzle 24 by the rubber material 37, whereby a width dimension of the slit 25 is kept constant. FIG. 1 shows a state in which the slit 25 is kept at a predetermined width dimension by the screw member 35. When the nozzle 24 is moved until the slit forming surface 26 contacts with the gas supplying surface 18, the width dimension becomes zero. Thus, the width dimension of the slit 25 can be adjusted within a range of zero to the predetermined maximum value.

When the width dimension of the slit 25 is adjusted in the above manner, the flow rate of the air flowing along the tip surface of the carrying head 12 can be adjusted. Therefore, it is possible to change thickness of the air layer, change suspension ability in carrying the carried object W depending on a load of the carried object W, and adjust a distance between the carrying head 12 and the carried object W even when floating and carrying the carried object W. On the other hand, in the case where the holding surface 21 or the like of the carrying head 12 is cleaned, as shown in FIG. 2, the nozzle 24 is moved in the axial direction until the slit forming surface 26 contacts with the gas supplying surface 18 by rotating the screw member 35. Therefore, the width of the slit 25 becomes zero, and the gas supplying hole 19 is closed by the disk portion 24b of the nozzle 24. Under such a state, even when the carrying head 12 is cleaned by spraying the carrying head 12 with a cleaning solution, foreign matters such as the cleaning solution are prevented from intruding into the air pocket 27 and the gas supplying hole 19.

In the case of carrying the carried object W using the non-contact carrying device, the carrying head 12 is attached, in the base plate 11, to a robot arm or a moving member reciprocating vertically and horizontally. Carrying form of the carried object W includes: the case of carrying the carried object W in a state of sucking and suspending the carried object W below the carrying head 12; and the case of carrying the carried object W in a state of floating the carried object W on the carrying head 12. Also in both of the cases, the carried object W is carried in the non-contact state without contacting with the carrying head 12. For example, in the case of carrying the carried object W in a state of being suspended, when the carrying head 12 is made to approach the carried object W while the air flows along the tip surface of the carrying head 12, the carried object W is floated and approaches the carrying head 12 due to negative pressure air generated in front of the carrying head 12 and the carried object W is sucked to the carrying head 12 in the non-contact state. At this time, the air flowing along the tip surface adheres to the tapered surface 23 and flows toward a side of the base end portion of the carrying head 12. Therefore, the air separated from the carrying head 12 is prevented from influencing the carried object W.

The non-contact carrying device can carry, as the carried object W, not only a thin and easily elastically deformable carried object and a carried object with high rigidity but also food such as cookies, and the carried object W can be carried while held with an optimum suction force by adjusting the width of the slit 25 along with the air pressure according to the kind of the carried object W. This is the same case as when the carried object W is carried while floated.

Figure 5:
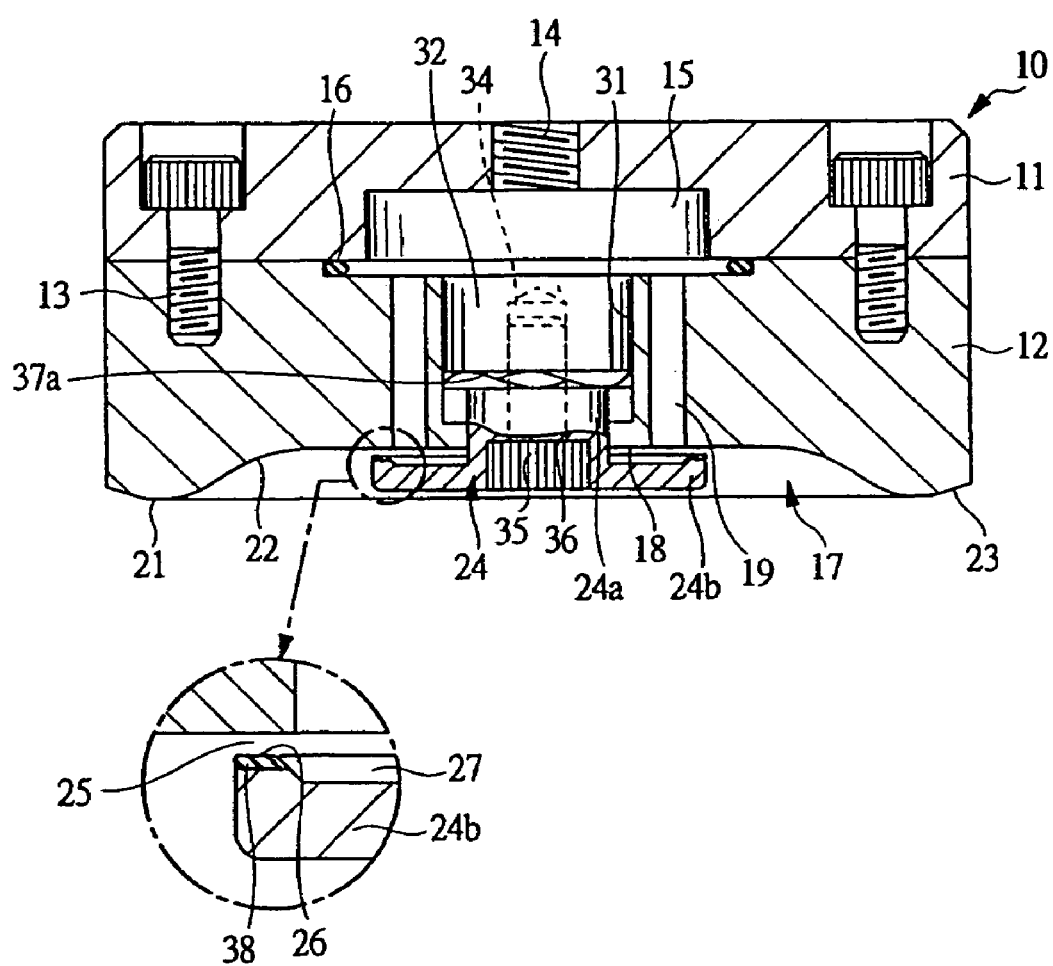
FIG. 5 is a sectional view showing a non-contact carrying device according to another embodiment of the present invention.

FIG. 5 is a sectional view showing a non-contact carrying device according to another embodiment of the present invention. In FIG. 5, members common to those described in the above-mentioned embodiment are denoted by the same reference numeral.

In the non-contact carrying device, a wave washer 37a, which serves as an elastic member for applying an elastic force to the nozzle 24 in a direction of enlarging the width of the slit 25, is incorporated between the supporting block 32 and the nozzle 24. Thus, as the elastic member, a metal spring material may be used like the wave washer 37a, the rubber material 37 as described above may be used, or a spring may be used. As shown in FIG. 5, a sealing member 38 made of an annular rubber is attached to an inner surface of the nozzle 24. Accordingly, when the width of the slit 25 is set at zero, the sealing member 38 contacts with the gas supplying surface 18, so that a cleaning solution or foreign matter is prevented from intruding into the air pocket 27 and the gas supplying hole 19 during the cleaning. Thus, in the case where the sealing member 38 is provided, a surface of the sealing member 38 serves as the slit forming surface 26.

The present invention is not limited to the above embodiments, and may be variously modified within a scope of not departing from the gist thereof. For example, although the compressed air is discharged from the slit 25 through the gas supplying hole 19 in the above-mentioned embodiment, other kinds of gas such as inert gas may be supplied.

INDUSTRIAL APPLICABILITY

The non-contact carrying device according to the present invention is used to carry, as a carried object, a semiconductor wafer or the like in a non-contact state from one position to another.

The invention claimed is:

1. A non-contact carrying device for holding and carrying a carried object in a non-contact state, the device comprising:
   a carrying head having a tip surface including a gas supplying surface in which an opening of a gas supplying hole is formed defining an axis, an annular holding surface lying radially outward of the gas supplying surface and offset from the gas supplying hole along the axis, and a gas guiding surface smoothly connecting the gas supplying surface with the annular holding surface;
   a nozzle provided with a base portion mounted on the carrying head and a disk portion facing to the gas supplying surface and forming an annular slit for discharging gas between the gas supplying surface and the disk portion; and
   a nozzle-moving member changing width of the slit by moving the nozzle in an axial direction with respect to the carrying head,
   wherein the nozzle-moving member is a screw member mounted on the nozzle and screwed to the carrying head, and the carrying head is provided with an elastic member for applying an elastic force to the nozzle in a direction of enlarging the width of the slit.

2. A non-contact carrying device for holding and carrying a carried object in a non-contact state, the device comprising:
   a carrying head having a tip surface including a gas supplying surface in which an opening of a gas supplying hole is formed defining an axis, an annular holding surface located radially outward from the gas supplying surface and offset from the gas supplying hole along the axis, and a gas guiding surface smoothly connecting the gas supplying surface with the annular holding surface;
   a nozzle provided with a base portion mounted on the carrying head and a disk portion facing to the gas supplying surface and forming an annular slit for discharging gas between the gas supplying surface and the disk portion;
   a nozzle-moving member opening and closing the slit by moving the nozzle in an axial direction with respect to the carrying head; and
   a sealing member mounted on an outer circumferential portion of the disk portion so as to face to the gas supplying surface and prevent a foreign matter from intruding into the gas supplying hole when the slit is closed.

* * * * *